United States Patent [19]
Huang et al.

[11] Patent Number: 5,827,753
[45] Date of Patent: Oct. 27, 1998

[54] MONOLITHIC INTEGRATION OF DRIVER CIRCUITS WITH LED ARRAY AND METHODS OF MANUFACTURE

[75] Inventors: Rong-Ting Huang, Gilbert; Phil Wright, Scottsdale; Chan-Long Shieh, Paradise Valley; Paige M. Holm, Phoenix, all of Ariz.

[73] Assignee: Motorola, Inc., Schaumburg, Ill.

[21] Appl. No.: 820,850

[22] Filed: Mar. 20, 1997

[51] Int. Cl.⁶ .................................................. H01L 21/338
[52] U.S. Cl. ................... 438/24; 438/34; 438/169
[58] Field of Search .................. 438/23, 24, 34, 438/167, 169, 604, 606

[56] References Cited

U.S. PATENT DOCUMENTS

| | | | |
|---|---|---|---|
| 4,710,478 | 12/1987 | Yoder et al. | 438/169 |
| 4,879,250 | 11/1989 | Chan | 438/24 |
| 5,444,016 | 8/1995 | Abrokwah et al. | 438/169 |
| 5,583,072 | 12/1996 | Whitney | 438/24 |

*Primary Examiner*—Chandra Chaudhari
*Attorney, Agent, or Firm*—Eugene A. Parsons

[57] ABSTRACT

A method of fabricating a monolithically integrated LED array and driving circuitry includes sequentially forming overlying layers of material on the surface of a semiconductor substrate, the layers cooperating to emit light when activated. An insulating layer is formed on the layers and the layers are isolated into an array area and driver circuitry areas with row and column dividers dividing the array area into an array of LEDs arranged in rows and columns. Row and column driver circuits are formed on the insulating layer in the driver circuitry areas and row and column buses individually couple each LED in the array to row and column driver circuits.

19 Claims, 8 Drawing Sheets

MONOLITHIC INTEGRATION OF DRIVER CIRCUITS WITH LED ARRAY AND METHODS OF MANUFACTURE

FIELD OF THE INVENTION

The present invention pertains to arrays of light emitting devices and more specifically to the integration of driver circuits with light emitting device arrays and methods of manufacture.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting device (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices.

Also, organic light emitting diodes or organic electroluminescent devices and arrays thereof (hereinafter included as LEDs) are emerging as a potentially viable design choice for use in small products, especially small portable electronic devices, such as pagers, cellular and portable telephones, two-way radios, data banks, etc. organic LED arrays are capable of generating sufficient light for use in displays under a variety of ambient light conditions (from little or no ambient light to bright ambient light). Further, organic LEDs can be fabricated relatively cheaply and in a variety of sizes from very small (less than a tenth millimeter in diameter) to relatively large (greater than an inch) so that organic LED arrays can be fabricated in a variety of sizes. Also, organic LEDs have the added advantage that their emissive operation provides a very wide viewing angle.

A major disadvantage in the use of LED arrays is the complexity of the manufacturing process. In passive arrays, for example, each LED requires two contacts, generally an anode and a cathode, connected to column and row buses. The arrays are generally manufactured by depositing materials on a supporting substrate and addressing/driver connections to row and column buses are made around the edges. In the prior art, a hybrid LED array semiconductor die is mounted on a supporting substrate, such as glass, along with silicon driver dies to form a complete structure. A problem with this structure is that the number of input/output (I/O) terminals of the driver dies must match the I/O count of the LED array. Thus, the size of the supporting substrate is limited at the array size of interest by the I/O pads or terminals. Further, providing very small contact pads (e.g. bump pads) in an effort to improve the size, greatly reduces the assembly yield. Another problem in the driver circuitry arises because of the use of D-MESFETs, which have a relatively high power consumption with a poor reproducibility of MESFET characteristics and a complexity of integrated processing.

Accordingly, it would be beneficial to provide an LED array and driving circuitry which overcomes these problems.

It is a purpose of the present invention to provide a new and improved monolithically integrated LED array and driving circuitry.

It is also purpose of the present invention to provide a new and improved monolithically integrated LED array and driving circuitry which requires less manufacturing steps and is simpler to manufacture.

It is another purpose of the present invention to provide a new and improved monolithically integrated LED array and driving circuitry with reduced I/O count.

It is still another purpose of the present invention to provide a new and improved monolithically integrated LED array and driving circuitry which is easier and less expensive to fabricate and use.

It is a further purpose of the present invention to provide a new and improved monolithically integrated LED array and driving circuitry in which the LED array and driver circuitry are integrated onto a single substrate to greatly reduce the I/O count and matching problems.

It is a further purpose of the present invention to provide a new and improved monolithically integrated LED array and driving circuitry in which the driving circuitry includes CMOS circuitry.

SUMMARY OF THE INVENTION

The above problems and others are at least partially solved and the above purposes and others are realized in a method of fabricating a monolithically integrated LED array and driving circuitry including sequentially forming overlying layers of material on the surface of a semiconductor substrate, the layers cooperating to emit light when activated. An insulating layer is formed on the layers and the layers are isolated into an array area and driver circuitry areas with row and column dividers dividing the array area into an array of LEDs arranged in rows and columns. Row and column driver circuits are formed on the insulating layer in the driver circuitry areas and row and column buses individually couple each LED in the array to row and column driver circuits.

In a specific embodiment of a monolithically integrated LED array and driving circuitry the semiconductor substrate includes one of GaAs, SiC, semi-insulating GaAs, and Sapphire and the plurality of overlying layers of semiconductor material are sequentially epitaxially grown on the surface of the substrate. An insulating layer is positioned on the plurality of overlying layers and the plurality of overlying layers are isolated into an array area and driver circuitry areas with row and column dividers formed in the plurality of layers of material in the array area so as to divide the plurality of layers of material into an array of light emitting devices arranged in rows and columns. A plurality of portions of recrystallized amorphous silicon are positioned on the insulating layer in the driver circuitry area and a gate insulator layer with a gate metal layer on the gate insulator layer are positioned on each of the plurality of portions of recrystallized amorphous silicon to form an MOS gate. First and second spaced apart power terminals are formed on either side of the MOS gate in each of the plurality of portions of recrystallized amorphous silicon to define a field effect transistor. Electrical contacts are formed in communication with the first and second spaced apart power terminals and the gate metal layer and row and column buses are formed individually coupling each light emitting device in the array of light emitting devices to row and column driver circuits, respectively.

In another specific embodiment, the monolithically integrated LED array and driving circuitry includes a plurality of portions of recrystallized amorphous silicon positioned on the row dividers, one each adjacent each light emitting device. A gate insulator layer with a gate metal layer on the gate insulator layer are positioned on each of the plurality of portions of recrystallized amorphous silicon so as to form an MOS gate and a plurality of row buses connect the MOS gates into rows. First and second spaced apart power terminals are positioned on either side of the MOS gate in each of the plurality of portions of recrystallized amorphous silicon so as to define a plurality of field effect transistors which define an active array of LEDs.

BRIEF DESCRIPTION OF THE DRAWINGS

Referring to the drawings.

DESCRIPTION OF THE PREFERRED EMBODIMENTS

Figure 1:
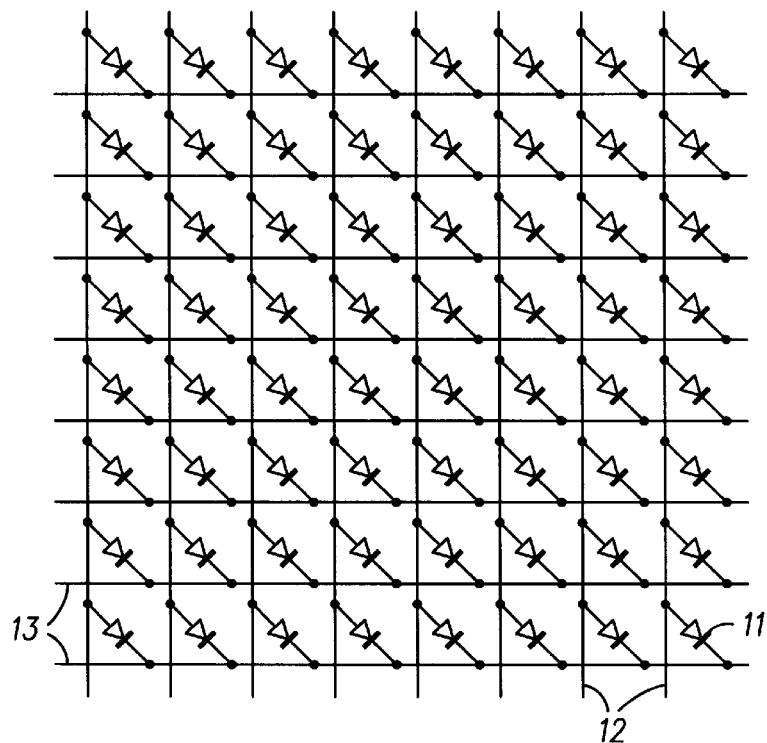
FIG. 1 is a simplified schematic diagram of a passive LED matrix and driver circuitry in accordance with the present invention.
Figure 2:
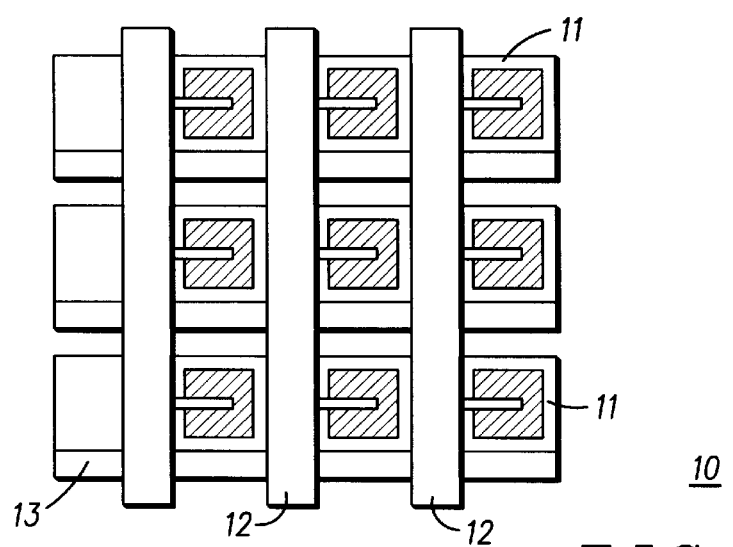
FIG. 2 is a simplified view in top plan of the passive matrix and driver circuitry of FIG. 1.

Turning now to the drawings, FIGS. 1 and 2 illustrate a simplified schematic drawing and a simplified view in top plan, respectively, of a passive LED array 10 and driver circuitry. Passive array 10 includes a plurality of LEDs 11 arranged in rows and columns with the anodes connected into columns by column buses 12 and the cathodes connected into rows by row buses 13. The column buses 12 are connected to column driver circuits 14 and the row buses 13 are connected to row driver circuits 15. As will be seen presently, array 10 and column and row driver circuits 14 and 15 are all formed on a single semiconductor substrate. Further, array 10 is formed in an array area, which in this specific embodiment is positioned generally centrally, and column and row drivers 14 and 15 are positioned in driver areas, which in this specific embodiment are positioned around the perimeter of the array area. Also, column drivers 14 and row drivers 15 are each split into two groups positioned on opposite sides of the array area so that alternate column buses terminate on opposite sides of the array area to allow more area for each driver and, similarly, alternate row buses terminate on opposite sides of the array area.

Figure 3:
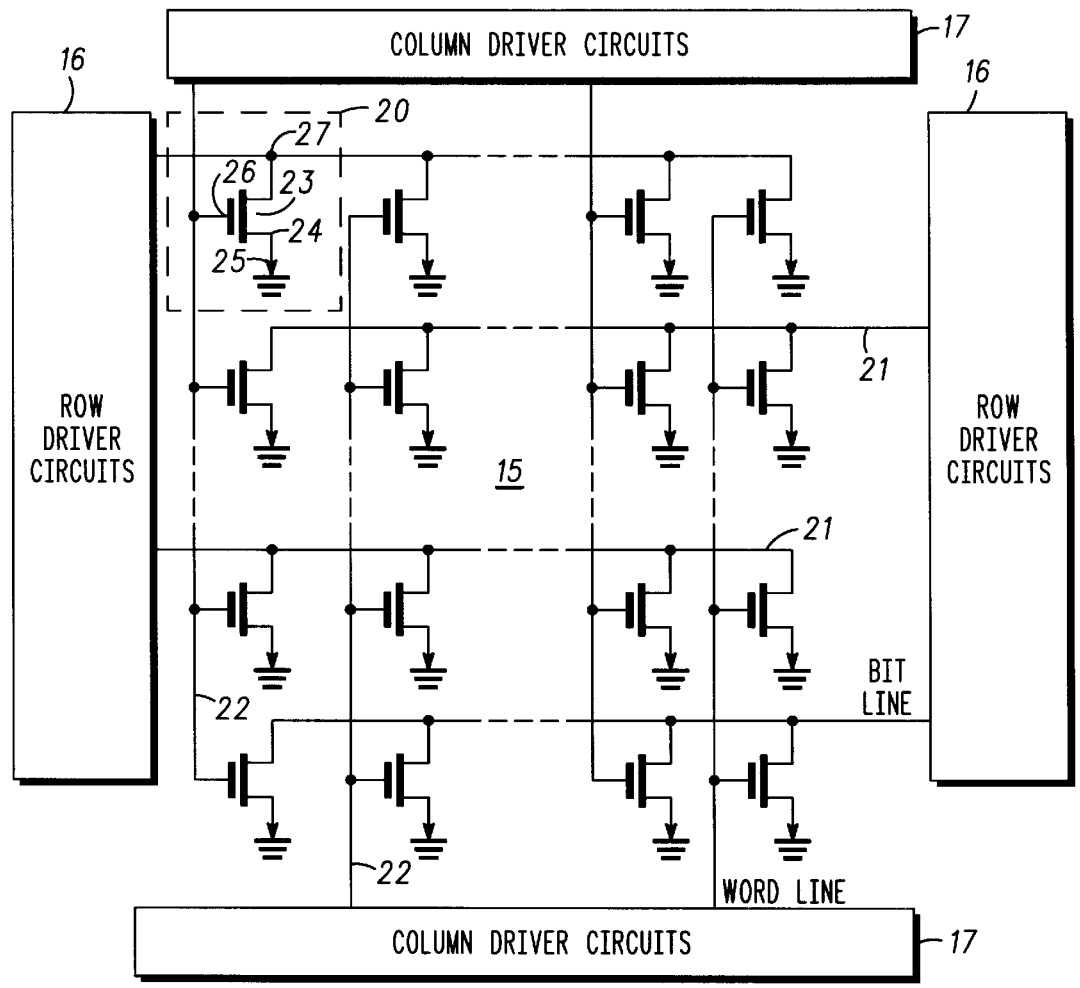
FIG. 3 is a simplified schematic diagram of an active LED matrix and driver circuitry in accordance with the present invention.

Referring specifically to FIG. 3, a simplified schematic diagram is illustrated of an active matrix 16, column driver circuits 17 and row driver circuits 18 in accordance with the present invention. As will be seen presently, active matrix 16 and column and row driver circuits 17 and 18 are all formed on a single semiconductor substrate. Further, active matrix 16 is formed in an array area, which in this specific embodiment is positioned generally centrally, and column and row drivers 17 and 18 are positioned in driver areas, which in this specific embodiment are positioned around the perimeter of the array area. Also, column drivers 17 and row drivers 18 are each split into two groups positioned on opposite sides of the array area so that alternate row buses terminate on opposite sides of the array area to allow more area for each driver and, similarly, alternate column buses terminate on opposite sides of the array area.

Active matrix 16 includes a plurality of pixels 20 arranged in columns and rows with each column having an associated column bus 21 and each row having an associated row bus 22. Each pixel 20 of active matrix 16 includes a field effect transistor (FET) 23 and a light emitting device (LED) 25. A source 24 of FET 23 is connected to the anode of the associated (LED) 25, a gate 26 is connected to the associated column bus 21, and a drain 27 is connected to the associated row bus 22. The cathode of LED 25 is connected to a common potential, such as ground. It will of course be understood that LEDs 25 could be constructed with the cathode connected to a power terminal of FET 23 and the anode connected to the common potential, such as ground, if convenient.

While a single FET 23 is illustrated to represent an active control circuit it will be understood by those skilled in the art that additional components can be incorporated within the concepts of the present invention. Also, while n-type MOSFETs are incorporated as the active switch and CMOS drivers are used as row and column drivers in the preferred embodiment, it will be understood that other components and types can be substituted in accordance with the precepts of this invention.

Figure 4:
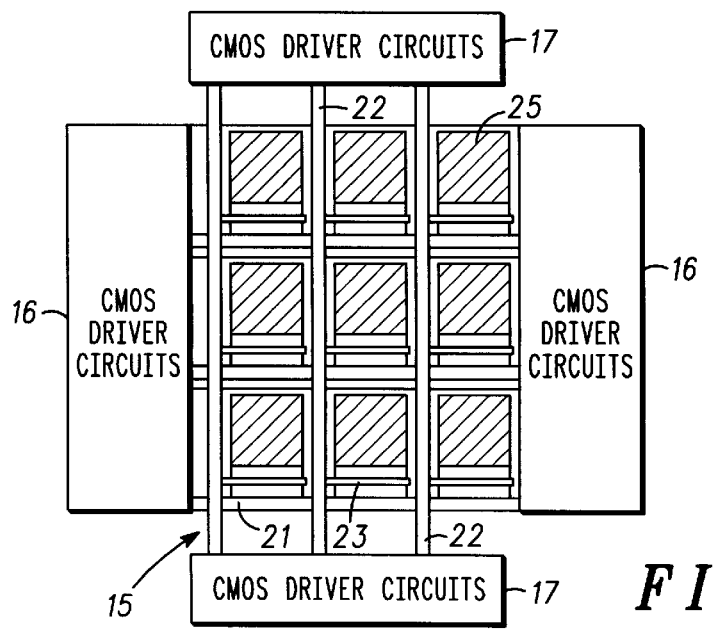
FIG. 4 is a simplified view in top plan of the active LED matrix and driver circuitry of FIG. 3.

Turning now to FIG. 4, a simplified view in top plan of active LED matrix 16 of FIG. 3 is illustrated along with column driver circuits 17 and row driver circuits 18. A FET 23 is positioned beside each associated LED 25 extending generally parallel to and in contact with an associated row bus 22. By extending FETs 23 as illustrated, with the gate 26 extending the width of the associated LED 25, the FET can carry more current while being constructed smaller. Gates 26 are described herein as being connected to column buses 21 and drains 27 are described as being connected to row buses 22 but it will be understood by those skilled in the art that the terms "rows" and "columns" are completely interchangeable and are not intended to limit passive array 10 or active matrix 16 to a specific orientation.

Figure 5:
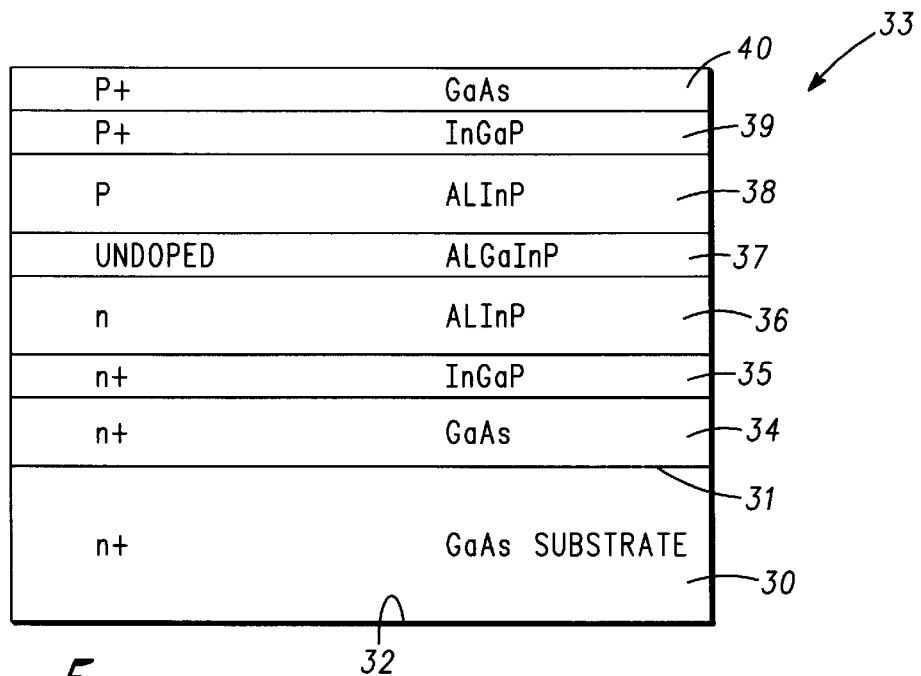
FIGS. 5–12 are simplified cross-sectional views illustrating various intermediate steps in the fabrication of the driver circuitry shown in FIGS. 2 and 4.

Turning now to FIGS. 5–12, simplified cross-sectional views illustrating various intermediate steps in the fabrication of the driver circuitry shown in either FIG. 2 or FIG. 4 are illustrated. Referring specifically to FIG. 5, a substrate 30 is illustrated, which in this specific embodiment is formed of gallium arsenide (GaAs) relatively heavily doped for n+conduction. Substrate 30 has an upper surface 31 and a lower surface 32. A plurality of layers 33 of material are positioned on upper surface 31 of substrate 30, with plurality of layers 33 cooperating to emit light when activated. It should be understood that plurality of layers 33 can include semiconductor material to form a semiconductor light emitting diode or organic material to form an organic electroluminescent device. In this specific embodiment plurality of layers 33 are epitaxially grown semiconductor layers.

A first layer 34 is epitaxially grown semiconductor material (n+GaAs) which acts as a buffer layer to crystalographically match the following layers to substrate 30. A second layer 35 is included to provide a match between the GaAs material system and the material system of the LEDs. Layer 35 includes n+doped InGaP. Layers 34 and 35 are heavily doped to provide lower electrical contact layers for array 15, as will be apparent presently. A third layer 36 is formed of lightly n doped AlInP and forms the cathode terminal for the LEDs. A fourth layer 37 is an active or light emitting layer of the LEDs and in this embodiment is undoped AlGaInP. Anode terminals for the LEDs are formed by a lightly p doped layer 38 of AlInP grown on fourth layer 37 with a material system matching layer 39 of heavily p+doped InGaP grown thereon and an upper contact layer 40 of heavily p+doped GaAs completing the plurality of layers 33.

Figure 6:
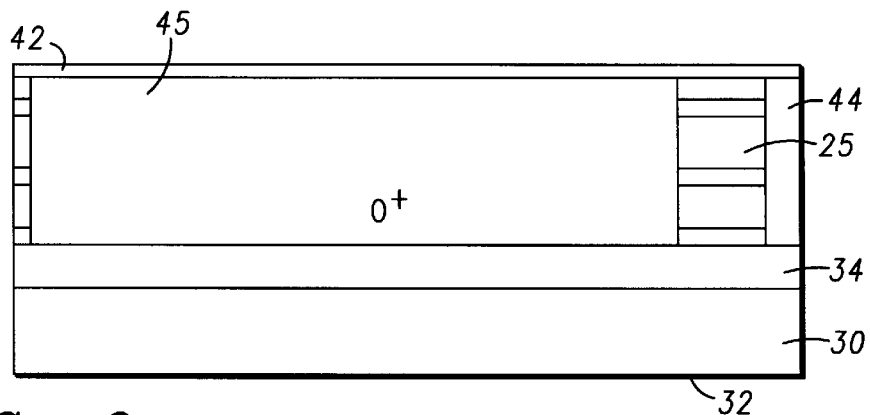

Referring specifically to FIG. 6, a dielectric layer 42, which may be, for example, silicon nitride ($Si_3N_4$), silicon dioxide ($SiO_2$), etc. is deposited on the upper surface of contact layer 40 to insulate contact layer 40 from the following structure. Column and row dividers are formed in plurality of layers 33 so as to divide plurality of layers 33 into an array of light emitting devices arranged in columns and rows, e.g. array 10 of FIG. 2 or active matrix 16 of FIG. 4. Also, driver circuitry areas are processed to increase the resistance and reduce any coupling between the driver circuitry and the LED array. It should be understood that in some applications dielectric layer 42 may provide sufficient isolation so that further processing of the plurality of layers 33 in the driver circuitry area is not necessary.

In this preferred embodiment, the column and row dividers are formed by implants, designated 44 in FIG. 6, and the driver circuitry areas are processed by implanting, designated 45 in FIG. 6. Implants 44 and 45 generally include some inactive material, such as oxygen ions (O+), hydrogen ions (H+), or the like, implanted in a well known manner at energies sufficiently high to carry implants 44 and 45 deep enough to isolate adjacent LEDs 25 (at least through active layer 37) by forming a high resistance volume surrounding each LED 25. It should be understood that FIGS. 5–12 are not drawn to scale and various portions are exaggerated in size for a complete understanding of the process and structure. Also, it will be seen presently, that various steps in the different processes (e.g. implants, layer formation, metallization, etc.) to be explained may simultaneously achieve different results in different areas and any description of the various process steps is not intended to limit the steps to a specific sequence.

Figure 7:
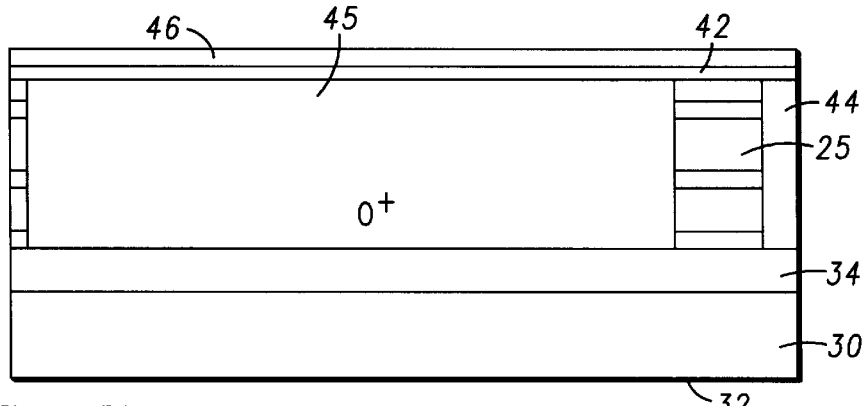
Figure 8:
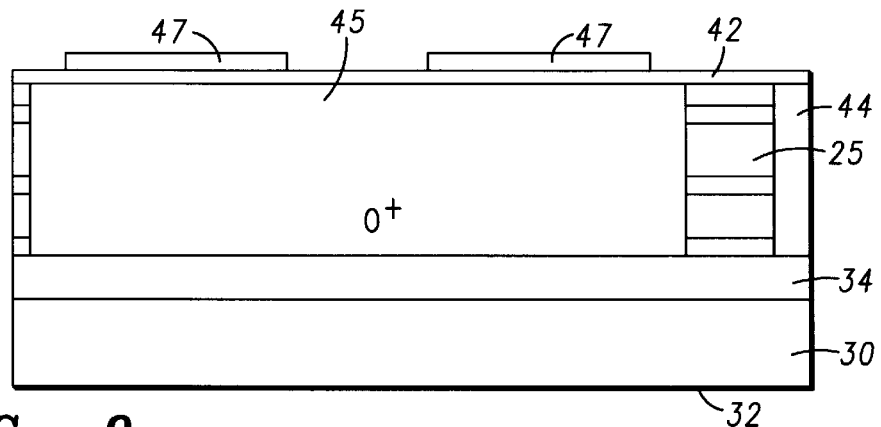

A plurality of portions of recrystallized amorphous silicon are patterned on implanted driver circuitry areas 45, generally as follows. A layer 46 of amorphous silicon is formed on the surface of dielectric layer 42, as illustrated in FIG. 7. Layer 46 of amorphous silicon is recrystallized utilizing any of the well known processes, including laser recrystallization (e.g. using an xcimer laser), thermal recrystallization, etc. The recrystallized amorphous silicon is then masked and etched, using any convenient procedure (e.g. dry or wet etch) to form portions 47 of recrystallized amorphous silicon on driver circuitry areas 45, as illustrated in FIG. 8. It will of course be understood that the patterning and recrystallization steps can be reversed, if convenient.

Figure 9:
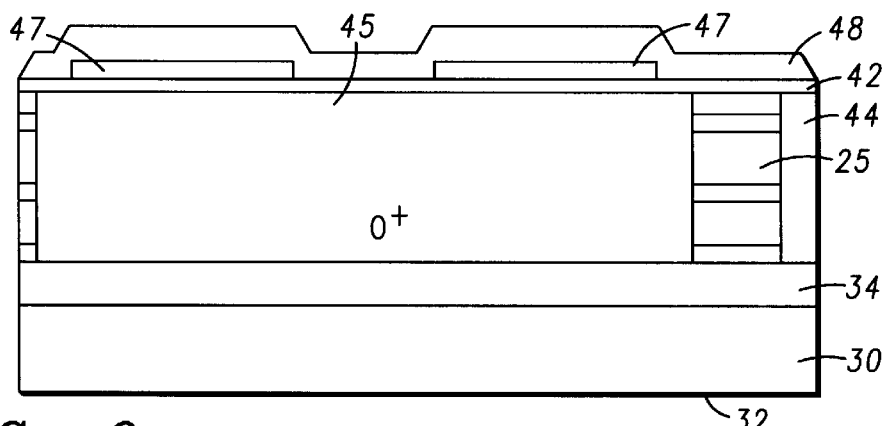

A plurality of metal-oxide-semiconductor field effect transistors (MOSFETs), one each are formed in each of portions 47. While each portion 47 can include one or more components, such as transistors, electronic switches. etc., in this specific embodiment a field effect transistor (FET) is incorporated because of the simplicity of manufacture. Portions 47 of recrystallized amorphous silicon are used as a substrate in which to form the MOSFETs, as described below. A thin layer 48 of gate dielectric, which in this preferred embodiment is a thermal or PECVD deposited oxide, is formed in a blanket over the entire driver circuitry area and array area, as illustrated in FIG. 9.

Figure 10:
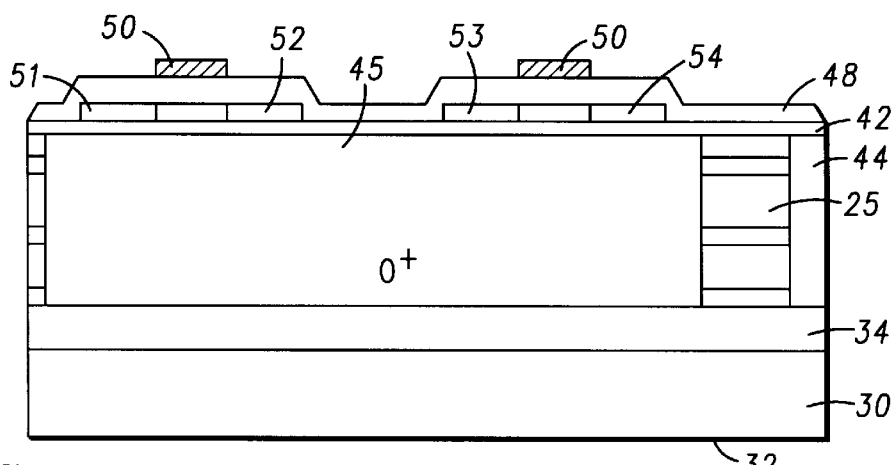

Gates 50 are deposited and patterned on layer 48 of dielectric material, approximately centrally over portion 47 of recrystallized amorphous silicon, as illustrated in FIG. 10. Gates 50 are formed of some convenient gate material, such as polysilicon, TiW, Al, etc. Gates 50 are then used as a self-aligned mask to implant power terminals, such as a source 51 and a drain 52, adjacent each gate 50 in each portion 47 of recrystallized amorphous silicon. In this example, the source and drain terminals 51 and 52 are implants which, when properly activated, produce n+doped areas that operate as spaced apart power terminals in a fashion that is well understood in the semiconductor art. It should be understood, however, that some of the FETs produced will have p+doped areas to form source and drain terminals 53 and 54, which p+doped areas are formed by simple masking and repeating the above steps, as will be understood by those skilled in the art.

Figure 11:
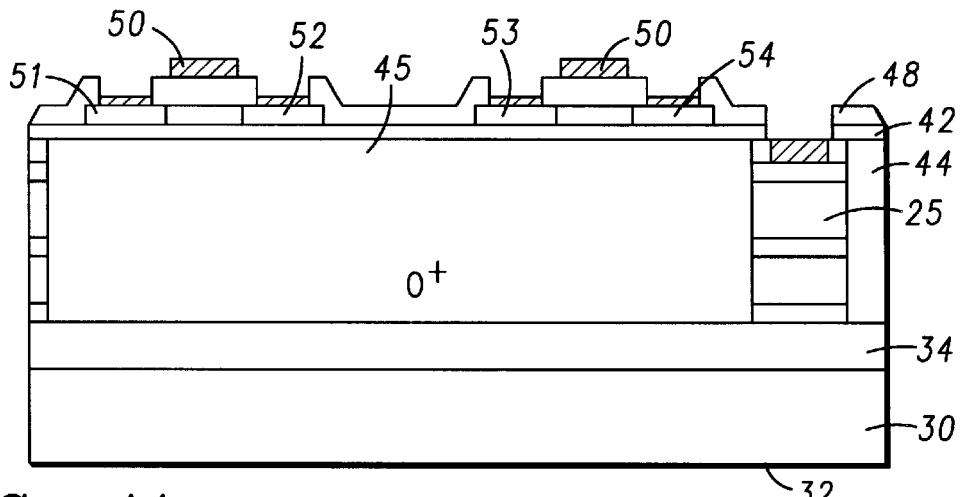
Figure 12:
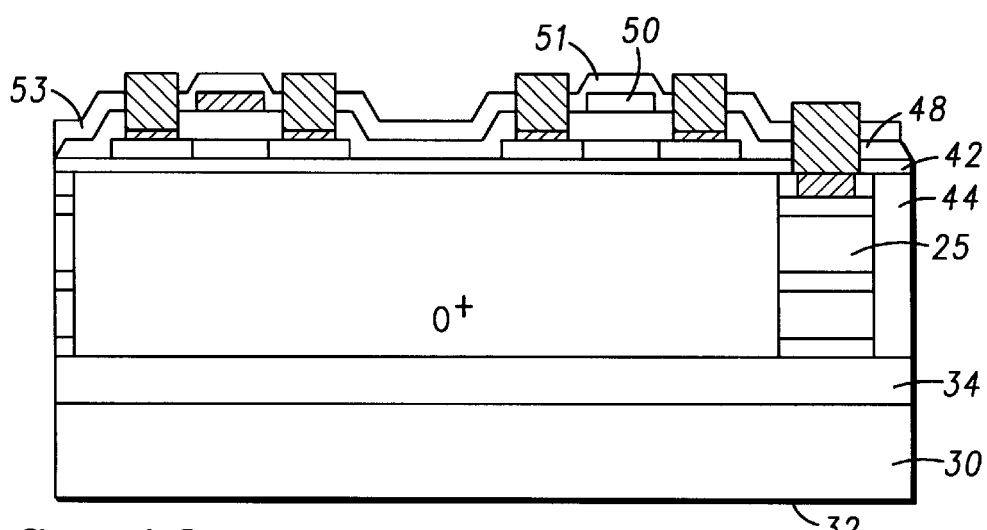

Openings are etched through layer 48 of dielectric material and dielectric layer 42 to open contact areas with each source 51 or 53 and drain 52 or 54, as well as LED anode 25a, and ohmic metal is deposited in the openings to form external contacts therewith, as illustrated in FIG. 11. A dielectric layer 53, such as $Si_3N_4$, is deposited in a blanket layer over the entire driver circuitry areas 45 and openings are again etched to provide contacts to each gate, source, and drain. Metallizations are then performed to connect the ohmic metal of each source 51 or 53 and drain 52 or 54, as illustrated in FIG. 12, to the appropriate I/O pads, column buses 12 or 21, or row buses 13 or 22, (not shown in FIG. 12). Thus, the metallizations connect all of the LEDs 25 in each column into column buses, which are also connected to column drivers 17, and all of the LEDs 25 in each row into row buses, which are also connected to row drivers 16.

Figure 13:
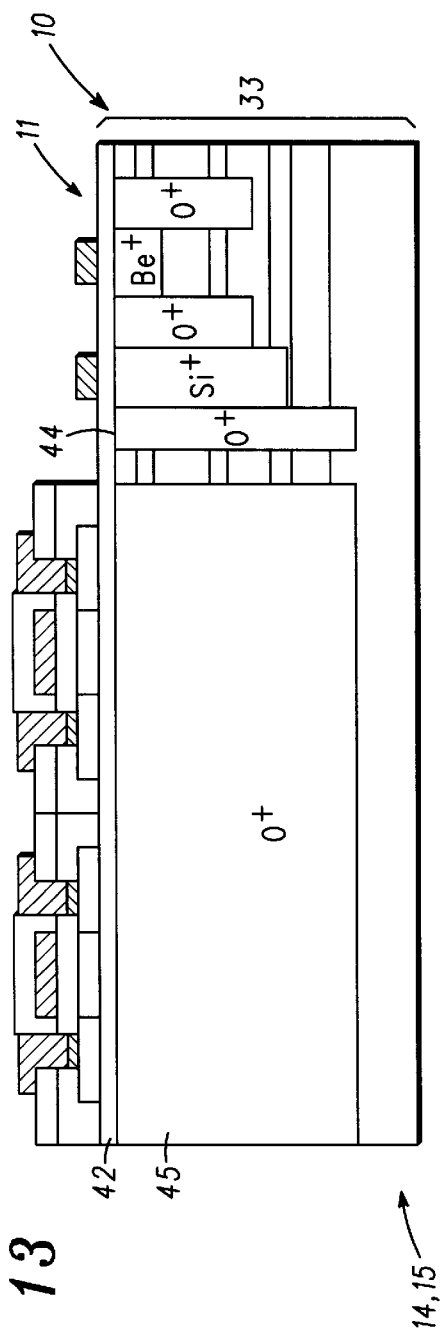
FIG. 13 is a simplified cross-sectional view of a completed passive LED matrix.

Turning now to FIG. 13, a simplified cross-sectional view of the driver circuitry described above and illustrated in FIGS. 5–12, is illustrated in conjunction with a passive LED array 10. For convenience a single LED 11 is illustrated in conjunction with a complementary pair of MOSFETS. Because the complementary pair of MOSFETS is formed on the surface of the plurality of layers 33, the metallization step or steps is convenient and simple. Also, because the driver circuitry is formed adjacent the LED array and on the same semiconductor substrate, the amount of metallization is greatly reduced and the number of I/O pads is greatly reduced.

Figure 14:
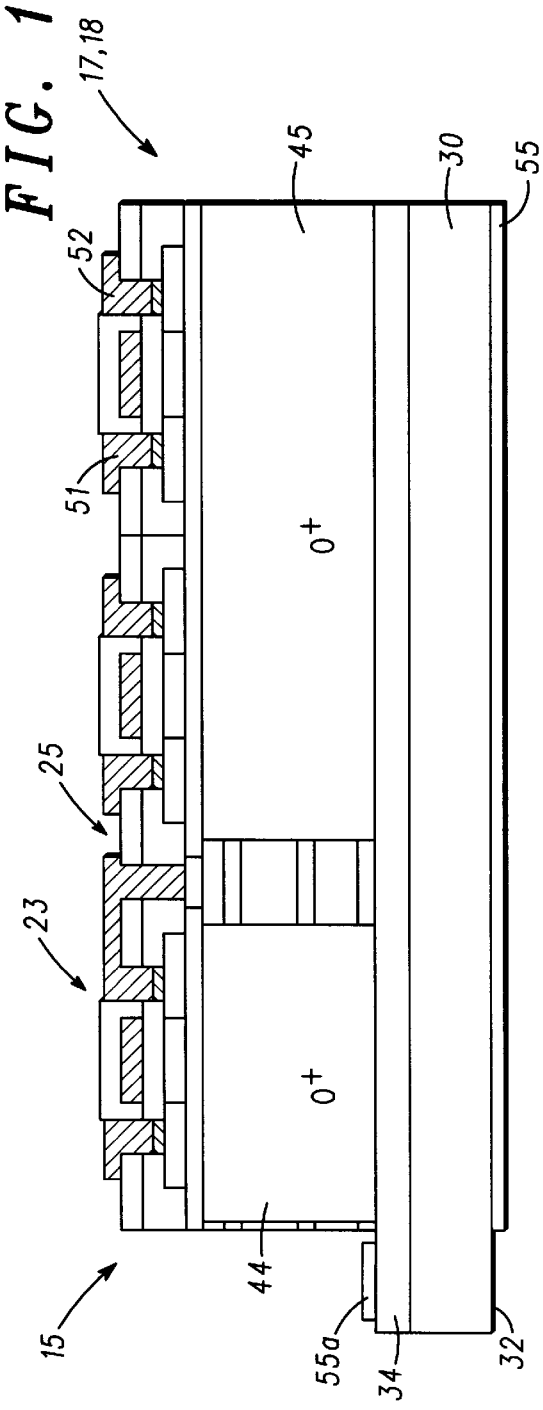
FIG. 14 is a simplified cross-sectional view of a completed active LED matrix.

Turning now to FIG. 14, a simplified cross-sectional view of the driver circuitry described above and illustrated in FIGS. 5–12, is illustrated in conjunction with an active LED matrix 16 such as that shown in FIG. 4. For convenience a single FET 23 and LED 25 is illustrated in conjunction with a complementary pair of MOSFETS. In this specific embodiment, a recrystallized amorphous silicon portion 47 is formed in the row dividers 44 adjacent each LED 25, generally at the same time as the formation of portions 47 for the complementary pairs of MOSFETs. As explained above, a blanket layer 46 of amorphous silicon is deposited and recrystallized utilizing any of the well known processes. The recrystallized amorphous silicon is then masked and etched, using any convenient procedure (e.g. dry or wet etch) to form portions 47 of recrystallized amorphous silicon on row dividers 44 and driver circuitry areas 45 (see FIG. 8). A metal-oxide-semiconductor field effect transistor (MOSFET) 23, is formed in each of portions 47 adjacent each LED 25. While each portion 47 can include one or more components, such as transistors, electronic switches. etc., in this specific embodiment a field effect transistor (FET) is incorporated because of the simplicity of manufacture and the efficiency of operation.

Portions 47 of recrystallized amorphous silicon are used as a substrate in which to form MOSFETs 23. A thin layer 48 of gate dielectric is formed in a blanket over the entire array area (see FIG. 9). Gates 50 are deposited and patterned on layer 48 of dielectric material, approximately centrally over portion 47 of recrystallized amorphous silicon (see FIG. 10) and used as a self-aligned mask to implant a source 51 or 53 and a drain 52 or 54 adjacent each gate 50. In this example, source and drain terminals 51, 53 and 52, 54 are implants which, when properly activated, produce n+doped areas that operate as spaced apart power terminals in a fashion that is well understood in the semiconductor art. It should be understood, however, that FETs 23 may have p+doped areas to form source and drain terminals if convenient.

Openings are etched through layer 48 of dielectric material and dielectric layer 42 to open contact areas with each source 51 or 53 and drain 52 or 54, as well as LED anode contact 25a, and ohmic metal is deposited in the openings to form external contacts therewith (see FIG. 11). A dielectric layer 53, such as $Si_3N_4$, is deposited in a blanket layer over the entire array area 44 and driver circuitry areas 45 and openings are again etched to provide contacts to each gate, source, and drain. Metallizations are then performed to connect the ohmic metal of each drain 52 to the adjacent row bus 22 and source 51 to the associated LED 25 (see FIG. 14). Thus, the metallizations connect all of the FETs 23 and LEDs 25 together and into row, which are also connected to row drivers 18. In this embodiment a common terminal is provided for each LED 25 in array 16 by depositing a layer of metal 55 on the back or reverse side of substrate 30, if substrate 30 is a doped semiconductor, such as GaAs, SiC, etc., or by depositing a contact 55a on an upper surface of conductive layer 34, if substrate 30 is formed of semi-insulating material or the like.

Figure 15:
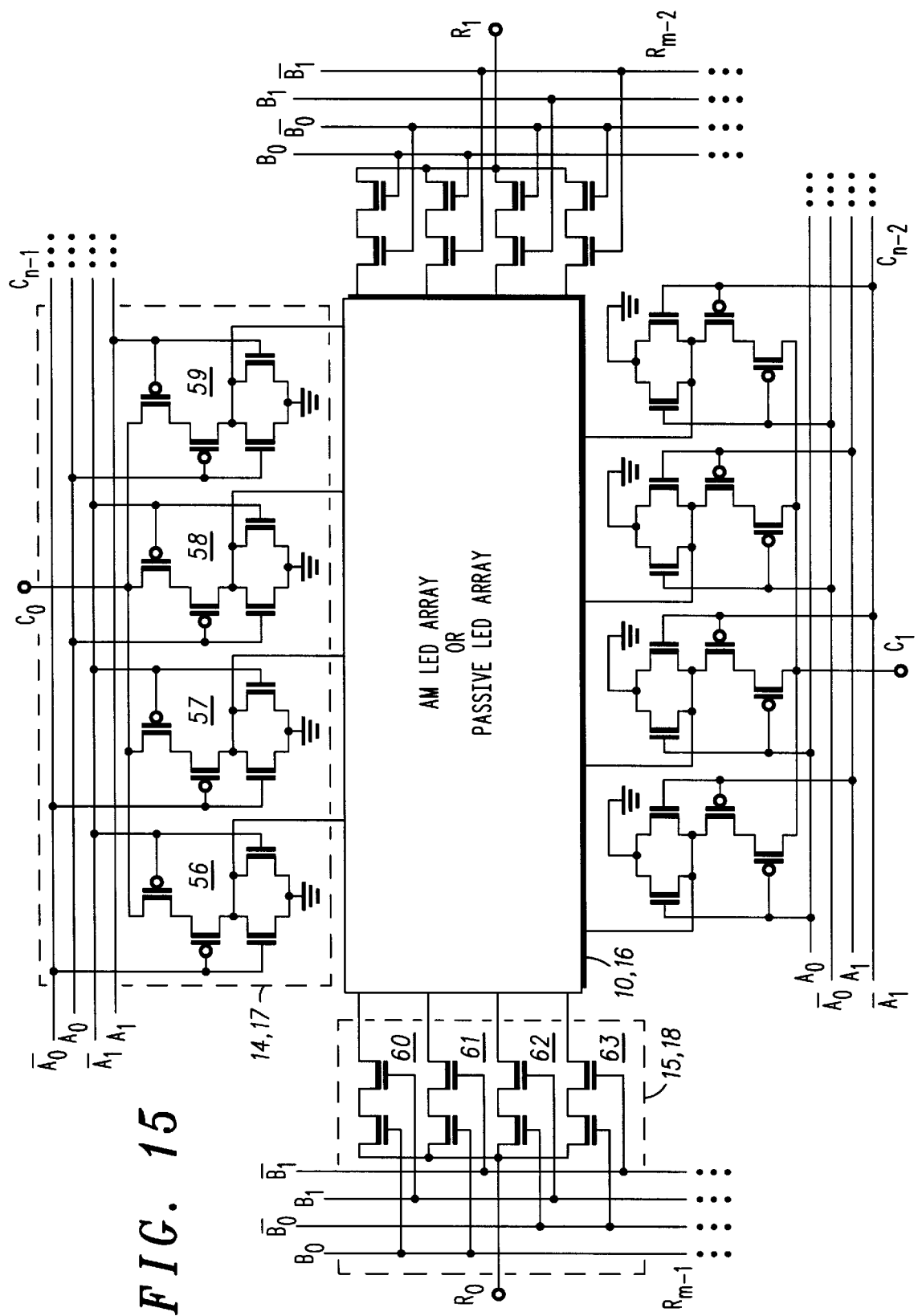
FIG. 15 is a schematic diagram of CMOS driver circuitry.

Referring now to FIG. 15, LED array 10/16 is illustrated in block form with driver circuits 14/17 or 15/18 illustrated schematically. For simplicity, a single column driver circuit 14/17, connected to four column buses 12/21, respectively, and a single row driver circuit 15/18, connected to four row buses 13/22, respectively, are illustrated. It should be understood that a similar column driver circuit and a similar row driver circuit are utilized for each additional four column buses and each additional four row buses, respectively, in passive LED array 10 or active LED array 16. In this specific embodiment, each column driver circuit 14/17 includes four CMOS NOR gates 56, 57, 58, and 59 connected to four column buses and logically coupled to four address lines connected to receive an appropriate combination of address signals $A_0$, $\overline{A_0}$, $A_1$, and $\overline{A_1}$ and to a data line $C_o$. Each row driver circuit 15/18 includes four MOSFET pairs 60, 61, 62, and 63 connected to four row buses and logically coupled to four address lines connected to receive an appropriate combination of address signals $B_0$, $\overline{B_0}$, $B_1$, $\overline{B_1}$ and to a return line $R_o$. Through an appropriate selection of address signals $A_0$, $\overline{A_0}$, $A_1$, and $\overline{A_1}$ and address signals $B_0$, $\overline{B_0}$, $B_1$, and $\overline{B_1}$ each LED in LED array 10/16 can be individually addressed. A complete description of the operation of this addressing scheme is disclosed in a copending application No. 08/652,075, filed on May 23, 1996, entitled "Drive Device and Method for Scanning a Monolithic Integrated LED Array" and assigned to the same assignee.

In the embodiment disclosed, when passive LED array 10 is included in the structure, terminals $C_o$ through $C_{n-1}$ connected to 'n' column driver circuits, are coupled to one or more voltage sources (not shown) and terminals $R_o$ through $R_{m-1}$ connected to 'm' row driver circuits, are coupled to one or more current sinks (not shown). When active LED array 16 is included in the structure, terminals $C_o$ through $C_{n-1}$ connected to 'n' column driver circuits, are coupled to a source of gate signals, such as a shift register or the like (not shown) and terminals $R_o$ through $R_{m-1}$ connected to 'm' row driver circuits, are coupled to one or more power sources (not shown).

Figure 16:
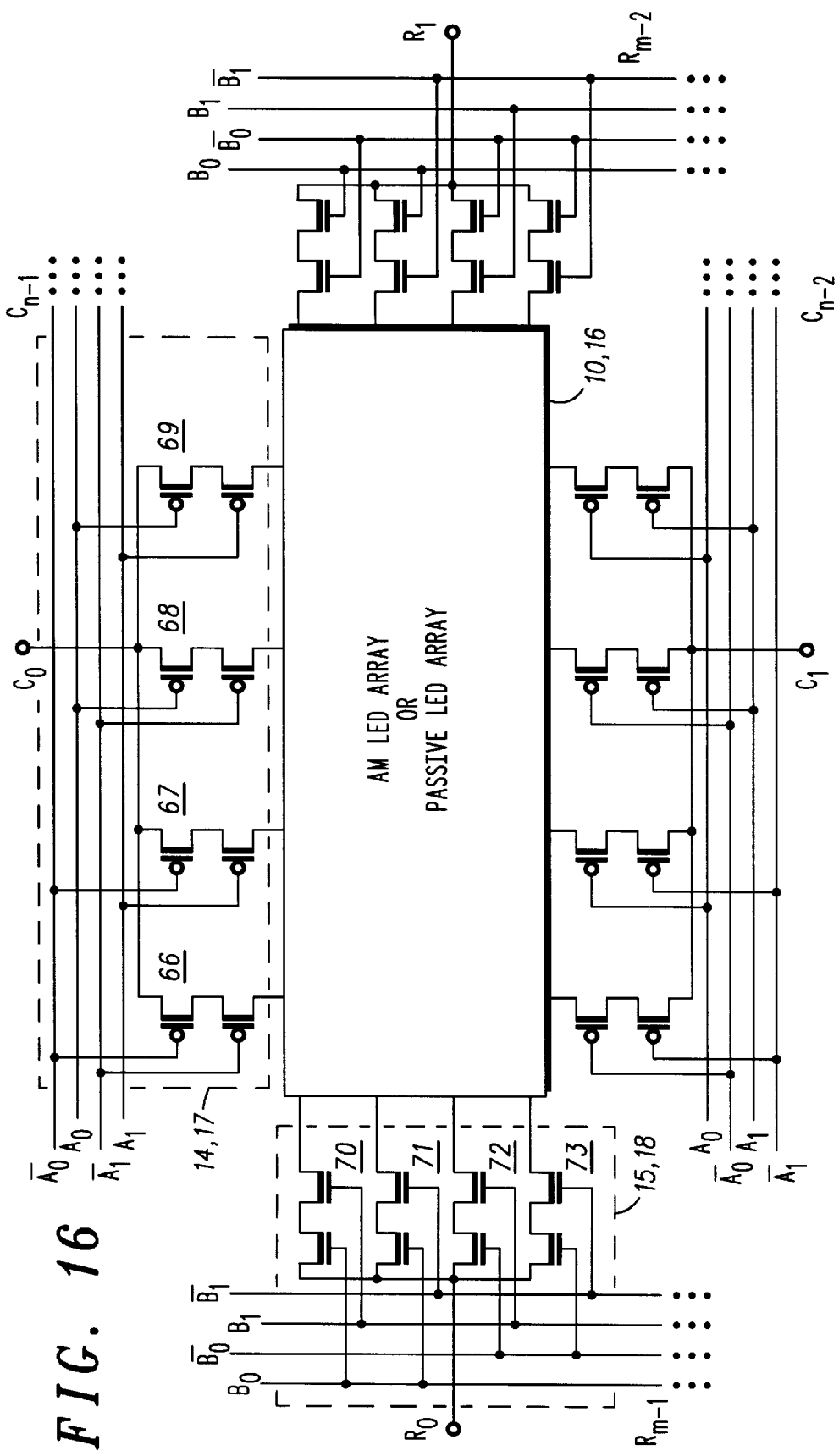
FIG. 16 is a schematic diagram of another embodiment of CMOS driver circuitry.

Referring now to FIG. 16, LED array 10/16 is illustrated in block form with driver circuits 14/17 or 15/18 illustrated schematically. For simplicity, a single column driver circuit 14/17, connected to four column buses 12/21, respectively, and a single row driver circuit 15/18, connected to four row buses 13/22, respectively, are illustrated. It should be understood that a similar column driver circuit and a similar row driver circuit are utilized for each additional four column buses and each additional four row buses, respectively, in passive LED array 10 or active LED array 16. In this specific embodiment, each column driver circuit 14/17 includes four pairs of p-MOSFETs 66, 67, 68, and 69 connected to four column buses and logically coupled to four address lines connected to receive an appropriate combination of address signals $A_0$, $\overline{A_0}$, $A_1$, and $\overline{A_1}$ and to a data line $C_o$. Each row driver circuit 15/18 includes four pairs of n-MOSFETs 70, 71, 72, and 73 connected to four row buses and logically coupled to four address lines connected to receive an appropriate combination of address signals $B_0$, $\overline{B_0}$, $B_1$, and $\overline{B_1}$ and to a return line Ro. Through an appropriate selection of address signals $A_0$, $\overline{A_0}$, $A_1$, and $\overline{A_1}$ and address signals $B_0$, $\overline{B_0}$, $B_1$, and $\overline{B_1}$ each LED in LED array 10/16 can be individually addressed. Although a decode switch with two MOSFETs in series is shown in FIG. 16, a decode switch with a single MOSFET can perform the same function by changing the duty cycle of address signals $A_0$, $\overline{A_0}$, $A_1$, and $\overline{A_1}$ and address signals $B_0$, $\overline{B_0}$, $B_1$, and $\overline{B_1}$.

In the embodiment disclosed, when passive LED array 10 is included in the structure, terminals $C_o$ through $C_{n-1}$ connected to 'n' column driver circuits, are coupled to one or more voltage sources (not shown) and terminals $R_o$ through $R_{m-1}$ connected to 'm' row driver circuits, are coupled to one or more current sinks (not shown). When active LED array 16 is included in the structure, terminals $C_o$ through $C_{n-1}$ connected to 'n' column driver circuits, are coupled to a source of gate signals, such as a shift register or the like (not shown) and terminals $R_o$ through $R_{m-1}$ connected to 'm' row driver circuits, are coupled to one or more power sources (not shown).

Thus, it can be seen that the I/O count is greatly improved and the area required for interconnects is greatly reduced because the driver circuits and the array are formed as a single monolithic integrated circuit. Also, the number of process steps required to form a complete structure are greatly reduced. Further, by incorporating MOSFETS, and specifically complementary MOSFET circuits for driving the LED array, simpler and more reliable transistors are provided and the power requirements are greatly reduced. By incorporating an active circuit with each LED in the array, the size of the column and row buses are greatly reduced and less driving power is required.

Thus, a new and improved monolithic integration of driver circuitry and LED array has been disclosed with a substantial reduction in I/O pads and which is easier and less expensive to fabricate and use. Further, the new and improved LED array and driving circuitry includes MOSFETs which are connected in complementary circuits that result in a substantial saving in power and connecting area.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a monolithically integrated LED array and driving circuitry comprising the steps of:

providing a semiconductor substrate having a surface;

sequentially forming a plurality of overlying layers of material on the surface of the substrate, the plurality of layers of material cooperating to emit light when activated;

positioning an insulating layer on the plurality of overlying layers;

isolating the plurality of layers into an array area and driver circuitry areas and forming row and column dividers in the plurality of layers of material in the array area so as to divide the plurality of layers of material into an array of light emitting devices arranged in rows and columns; and forming row and column driver circuits on the insulating layer in the driver circuitry areas and row and column buses individually coupling each light emitting device in the array of light emitting devices to row and column driver circuits, respectively.

2. A method of fabricating a monolithically integrated LED array and driving circuitry as claimed in claim 1 wherein the step of providing the semiconductor substrate includes providing a substrate of one of GaAs, SiC, semi-insulating GaAs, and Sapphire.

3. A method of fabricating a monolithically integrated LED array and driving circuitry as claimed in claim 1 wherein the step of forming the plurality of layers of material includes epitaxially growing layers of semiconductor material on the surface.

4. A method of fabricating a monolithically integrated LED array and driving circuitry as claimed in claim 1 wherein the step of forming the plurality of layers of material includes depositing layers of organic material.

5. A method of fabricating a monolithically integrated LED array and driving circuitry as claimed in claim 3 wherein the step of forming row and column dividers in the plurality of layers includes implanting material to increase the resistance and isolate the light emitting devices from each other.

6. A method of fabricating a monolithically integrated LED array and driving circuitry as claimed in claim 5 wherein the step of implanting material to increase the resistance and isolate the light emitting devices includes implanting one of oxygen and hydrogen ions in semiconductor layers of material.

7. A method of fabricating a monolithically integrated LED array and driving circuitry as claimed in claim 1 wherein the step of forming row and column driver circuits includes the steps of:

patterning a plurality of portions of recrystallized amorphous silicon on the insulating layer in the driver circuitry area;

depositing a gate insulator layer and a gate metal layer on each of the plurality of portions of recrystallized amorphous silicon to form an MOS gate;

implanting first and second spaced apart power terminals in each of the plurality of portions of recrystallized amorphous silicon, using the MOS gate as a self-aligned mask; and forming electrical contacts in communication with the first and second spaced apart power terminals and the MOS gate.

8. A method of fabricating a monolithically integrated LED array and driving circuitry as claimed in claim 7 wherein the step of forming electrical contacts includes forming the row and column buses.

9. A method of fabricating a monolithically integrated LED array and driving circuitry as claimed in claim 1 wherein the step of forming row and column driver circuits on the insulating layer in the driver circuitry areas also includes forming a plurality of active control circuits on the row dividers one each associated with each light emitting device in the array.

10. A method of fabricating a monolithically integrated LED array and driving circuitry as claimed in claim 9 wherein the step of forming a plurality of active control circuits includes forming each active control circuit with first and second power terminals and a control terminal and connecting the first power terminal of each active control circuit to a first terminal of the associated light emitting device.

11. A method of fabricating a monolithically integrated LED array and driving circuitry as claimed in claim 9 wherein the step of forming a plurality of active control circuits includes the steps of:

patterning a plurality of portions of recrystallized amorphous silicon on the row dividers, one each adjacent each light emitting device;

depositing a gate insulator layer and a gate metal layer on the gate insulator layer on each of the plurality of portions of recrystallized amorphous silicon to form an MOS gate and forming a plurality of column buses connecting the MOS gates into columns; and implanting first and second spaced apart power terminals in each of the plurality of portions of recrystallized amorphous silicon, using the MOS gate as a self-aligned mask, to define a plurality of field effect transistors.

12. A method of fabricating a monolithically integrated LED array and driving circuitry as claimed in claim 9 including in addition a step of forming a common second terminal for each light emitting device.

13. A method of fabricating a monolithically integrated LED array and driving circuitry as claimed in claim 12 wherein the step of forming the second common terminal includes forming an ohmic metal contact on a reverse side of the substrate.

14. A method of fabricating a monolithically integrated LED array and driving circuitry as claimed in claim 1 wherein the step of forming row and column driver circuits includes forming at least a series connected pair of MOSFETs of a first conductivity in each column driver circuit and at least a series connected pair of MOSFETs of a second conductivity in each row driver circuit connected for complementary operation.

15. A method of fabricating a monolithically integrated LED array and driving circuitry comprising the steps of:

provided a semiconductor substrate including one of GaAs, SiC, semi-insulating GaAs, and Sapphire having a surface;

sequentially epitaxially growing a plurality of overlying layers of semiconductor material on the surface of the substrate, the plurality of layers of material cooperating to emit light when activated;

positioning an insulating layer on the plurality of overlying layers;

isolating the plurality of layers into an array area and driver circuitry areas and forming row and column dividers in the plurality of layers of material in the array area so as to divide the plurality of layers of material into an array of light emitting devices arranged in rows and columns;

patterning a plurality of portions of recrystallized amorphous silicon on the insulating layer in the driver circuitry area;

depositing a gate insulator layer and a gate metal layer on the gate insulator layer on each of the plurality of portions of recrystallized amorphous silicon to form an MOS gate;

implanting first and second spaced apart power terminals in each of the plurality of portions of recrystallized amorphous silicon, using the MOS gate as a self-aligned mask; and forming electrical contacts in communication with the first and second spaced apart power terminals and the gate metal layer and forming row and column buses individually coupling each light emitting device in the array of light emitting devices to row and column driver circuits, respectively.

16. A method of fabricating a monolithically integrated LED array and driving circuitry as claimed in claim 15 including in addition the steps of:

patterning a plurality of portions of recrystallized amorphous silicon on the row dividers, one each adjacent each light emitting device;

depositing a gate insulator layer and a gate metal layer on the gate insulator layer on each of the plurality of portions of recrystallized amorphous silicon to form an MOS gate and forming a plurality of row buses connecting the MOS gates into rows; and implanting first and second spaced apart power terminals in each of the plurality of portions of recrystallized amorphous silicon, using the MOS gate as a self-aligned mask, to define a plurality of field effect transistors.

17. A method of fabricating a monolithically integrated LED array and driving circuitry as claimed in claim 16 including in addition a step of forming a common second terminal for each light emitting device.

18. A method of fabricating a monolithically integrated LED array and driving circuitry as claimed in claim 17 wherein the step of forming the common second terminal includes forming an ohmic metal contact on a reverse side of the substrate.

19. A method of fabricating a monolithically integrated LED array and driving circuitry comprising the steps of:

providing a semiconductor substrate including one of GaAs, SiC, semi-insulating GaAs, and Sapphire having a surface;

sequentially epitaxially growing a plurality of overlying layers of semiconductor material on the surface of the substrate, the plurality of overlying layers of material cooperating to emit light when activated;

positioning an insulating layer on the plurality of overlying layers;

isolating the plurality of overlying layers into an array area and driver circuitry areas and forming row and column dividers in the plurality of overlying layers of material in the array area so as to divide the plurality of overlying layers of material into an array of light emitting devices arranged in rows and columns;

patterning a first plurality of portions of recrystallized amorphous silicon on the insulating layer in the driver circuitry area and patterning a second plurality of portions of recrystallized amorphous silicon on the row dividers, one each adjacent each light emitting device;

depositing a gate insulator layer and a gate metal layer on the gate insulator layer on each of the first and second pluralities of portions of recrystallized amorphous silicon to form an MOS gate;

implanting first and second spaced apart power terminals in each of the first and second pluralities of portions of recrystallized amorphous silicon, using the MOS gate as a self-aligned mask, to define a plurality of field effect transistors; and forming electrical contacts in communication with the first and second spaced apart power terminals and the gate metal layer and forming row and column buses individually coupling each light emitting device in the array of light emitting devices to row and column driver circuits, respectively.

* * * * *